United States Patent
Liu et al.

(10) Patent No.: US 10,072,892 B2
(45) Date of Patent: Sep. 11, 2018

(54) SEMICONDUCTOR WAFER SUPPORT RING FOR HEAT TREATMENT

(71) Applicant: SunEdison Semiconductor Limited (UEN201334164H), Signapore (SG)

(72) Inventors: Qingmin Liu, Glen Carbon, IL (US); William Lynn Luter, St. Charles, MO (US); Shawn George Thomas, Chesterfield, MO (US)

(73) Assignee: GLOBALWAFERS CO., LTD., Hsinchu (TW)

( * ) Notice: Subject to any disclaimer, the term of this patent is extended or adjusted under 35 U.S.C. 154(b) by 6 days.

(21) Appl. No.: 15/293,696

(22) Filed: Oct. 14, 2016

(65) Prior Publication Data

US 2017/0115063 A1    Apr. 27, 2017

Related U.S. Application Data

(60) Provisional application No. 62/246,180, filed on Oct. 26, 2015.

(51) Int. Cl.
| | | |
|---|---|---|
| F27D 5/00 | (2006.01) | |
| H01L 21/687 | (2006.01) | |
| H01L 21/67 | (2006.01) | |

(52) U.S. Cl.
CPC ...... *F27D 5/0037* (2013.01); *H01L 21/67109* (2013.01); *H01L 21/68721* (2013.01)

(58) Field of Classification Search
CPC ........ F27D 5/00; F27D 5/0025; F27D 5/0006; H01L 21/68742; H01L 21/6875; H01L 21/67309
See application file for complete search history.

(56) References Cited

U.S. PATENT DOCUMENTS

| | | | |
|---|---|---|---|
| 5,334,257 A | 8/1994 | Nishi et al. | |
| 5,482,558 A | 1/1996 | Watanabe et al. | |
| 5,718,574 A * | 2/1998 | Shimazu | C23C 16/4583 269/296 |
| 5,820,367 A * | 10/1998 | Osawa | C30B 25/12 432/152 |
| 6,361,313 B1 | 3/2002 | Beyaert et al. | |
| 6,474,987 B1 | 11/2002 | Nakai et al. | |
| 6,488,497 B1 | 12/2002 | Buckley et al. | |
| 6,576,064 B2 | 6/2003 | Griffiths et al. | |
| 7,033,168 B1 | 4/2006 | Gupta et al. | |
| 7,163,393 B2 * | 1/2007 | Adachi | F27D 5/0037 211/41.18 |
| 7,204,887 B2 * | 4/2007 | Kawamura | H01L 21/67309 118/724 |
| 7,393,207 B2 * | 7/2008 | Imai | H01L 21/324 118/728 |
| 8,042,697 B2 * | 10/2011 | Gilmore | H01L 21/67309 211/41.18 |
| 8,420,554 B2 | 4/2013 | Gilmore | |
| 2010/0098519 A1 | 4/2010 | Shive et al. | |

* cited by examiner

*Primary Examiner* — Gregory A Wilson
(74) *Attorney, Agent, or Firm* — Armstrong Teasdale LLP (57) ABSTRACT

A support ring for supporting a semiconductor wafer in a boat of a vertical furnace used in processing of the semiconductor wafer includes a semicircular segment. The semicircular segment has an upper surface, a lower surface opposite the upper surface, a radial inner wall defining an inner radius, and a radial outer wall defining an outer radius. The support ring further includes protrusions in the upper surface of the semicircular segment. The protrusions extend above the upper surface.

3 Claims, 13 Drawing Sheets

SEMICONDUCTOR WAFER SUPPORT RING FOR HEAT TREATMENT

CROSS-REFERENCE TO RELATED APPLICATIONS

This application claims priority to U.S. Provisional Application No. 62/246,180, filed 26 Oct. 2015, the disclosure of which is hereby incorporated by reference in its entirety.

FIELD

This disclosure relates generally to heat treatment of semiconductor wafers and more specifically to wafer support rings for use in vertical heat treatment furnaces.

BACKGROUND

In the production of semiconductor wafers, wafers typically undergo one or more heat treatments. In some cases, the semiconductor wafers are annealed to decrease the number of dislocations within the semiconductor wafers. As part of the annealing process, the semiconductor wafers are supported within a furnace and heated to above the recrystallization temperature of the semiconductor wafers. In some cases, the semiconductor wafers undergo a thermal oxidation process. During this process, the semiconductor wafers are heated in the presence of an oxidizing agent that reacts with the semiconductor wafers to form a layer of oxide on the surfaces of the wafers.

During the one or more heat treatments, the semiconductor wafers rest on wafer support rings within a furnace. As the semiconductor wafers and wafer support rings are heated, the semiconductor wafers and the wafer support rings may expand and move in relation to each other. This movement may damage the semiconductor wafers and cause wafer slips. Moreover, the semiconductor wafers may partially adhere to the wafer support rings during the heat treatments, which could cause the semiconductor wafers to be damaged during removal from the wafer support rings.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a support ring for supporting a semiconductor wafer in a boat of a vertical furnace used in processing of the semiconductor wafer includes a semicircular segment. The semicircular segment has an upper surface, a lower surface opposite the upper surface, a radial inner wall defining an inner radius, and a radial outer wall defining an outer radius. The support ring further includes protrusions in the upper surface of the semicircular segment. The protrusions extend above the upper surface.

In another aspect, a support ring for supporting a semiconductor wafer in a boat of a vertical furnace used in processing of the semiconductor wafer includes a semicircular segment. The semicircular segment has an upper surface, a lower surface opposite the upper surface, a radial inner wall, and a radial outer wall. The support ring further includes a plateau on the upper surface of the semicircular segment and extending above the upper surface. The upper surface extends from the plateau to the radial outer wall.

In another aspect, a support ring for supporting a semiconductor wafer in a boat of a vertical furnace used in processing of the semiconductor wafer includes a semicircular segment. The semicircular segment has an upper surface, a lower surface opposite the upper surface, a radial inner wall, and a radial outer wall. The support ring further includes slots in the upper surface of the semicircular segment and pins. Each pin is located partially within a corresponding slot and extends above the upper surface.

In another aspect, a vertical furnace for processing a semiconductor wafers includes a chamber and a heating element adjacent the chamber for increasing the temperature of the chamber. A wafer boat holds the semiconductor wafers within the chamber. A support ring is insertable within the wafer boat for supporting one of the semiconductor wafers. The support ring includes a semicircular segment having an upper surface, a lower surface opposite the upper surface, a radial inner wall, and a radial outer wall. The support further includes slots in the upper surface of the semicircular segment and pins. Each pin is located partially within a corresponding slot and extends above the upper surface.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

PRIOR ART

PRIOR ART

Corresponding numbers indicate corresponding elements in the drawings.

DETAILED DESCRIPTION

Figure 1:
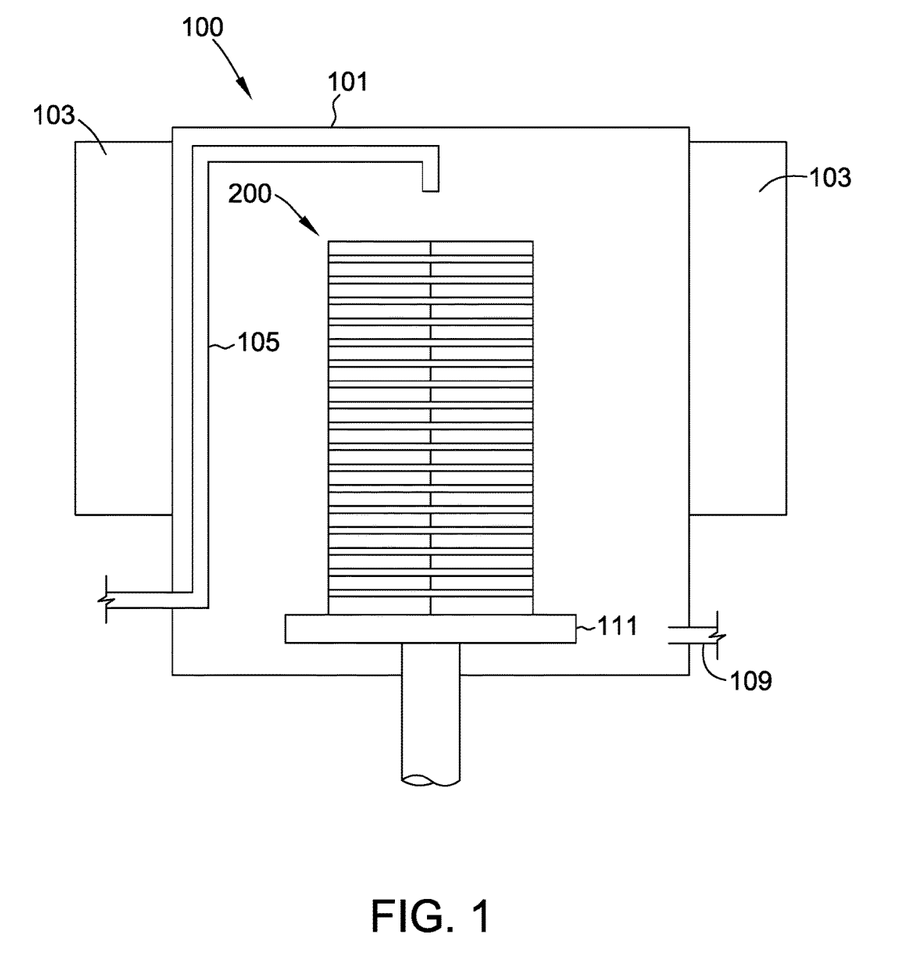
FIG. 1 is a schematic illustration of a vertical furnace for heat treating semiconductor or silicon wafers.

Referring to FIG. 1 a vertical furnace 100 is illustrated according to an embodiment. Vertical furnace 100 is used to heat treat semiconductor (e.g., silicon) wafers using one or more heat treating processes. Vertical furnace 100 has a chamber 101 in which the semiconductor wafers are heated using heating elements 103. A chamber 101 houses a wafer boat 200 during heat treatment. The wafer boat 200 supports a semiconductor wafers on wafer support rings 700. The semiconductor wafers may be subjected to any type of suitable heat treating process inside vertical furnace 100. For example, vertical furnace 100 may be used for annealing and/or thermal oxidation of the semiconductor wafers. During annealing and/or thermal oxidation, heating elements 103 may increase the temperature of chamber 101 to a temperature in a range from about 800° C. to about 1,200° C.

Vertical furnace 100 may include a gas inlet 105. Gas inlet 105 supplies one or more gasses during heat treatment of semiconductor wafers in vertical furnace 100. For example, gas inlet 105 may supply argon within chamber 101 during argon annealing of semiconductor wafers. Gas inlet 105 may also supply oxygen during thermal oxidation of semiconductor wafers. Gas inlet 105 may extend within chamber 101 to supply gas through a port above wafer boat 200. Vertical furnace 100 further includes exhaust outlet 109. Exhaust outlet 109 exhausts process gas and/or reaction gas from chamber 101. Vertical furnace 100 includes a table 111. Table 111 inserts wafer boat 200 into chamber 101 and removes wafer boat 200 from chamber 101. Table 111 may also rotate wafer boat 200 during heat treatment of the semiconductor wafers in wafer boat 200.

Figure 2:
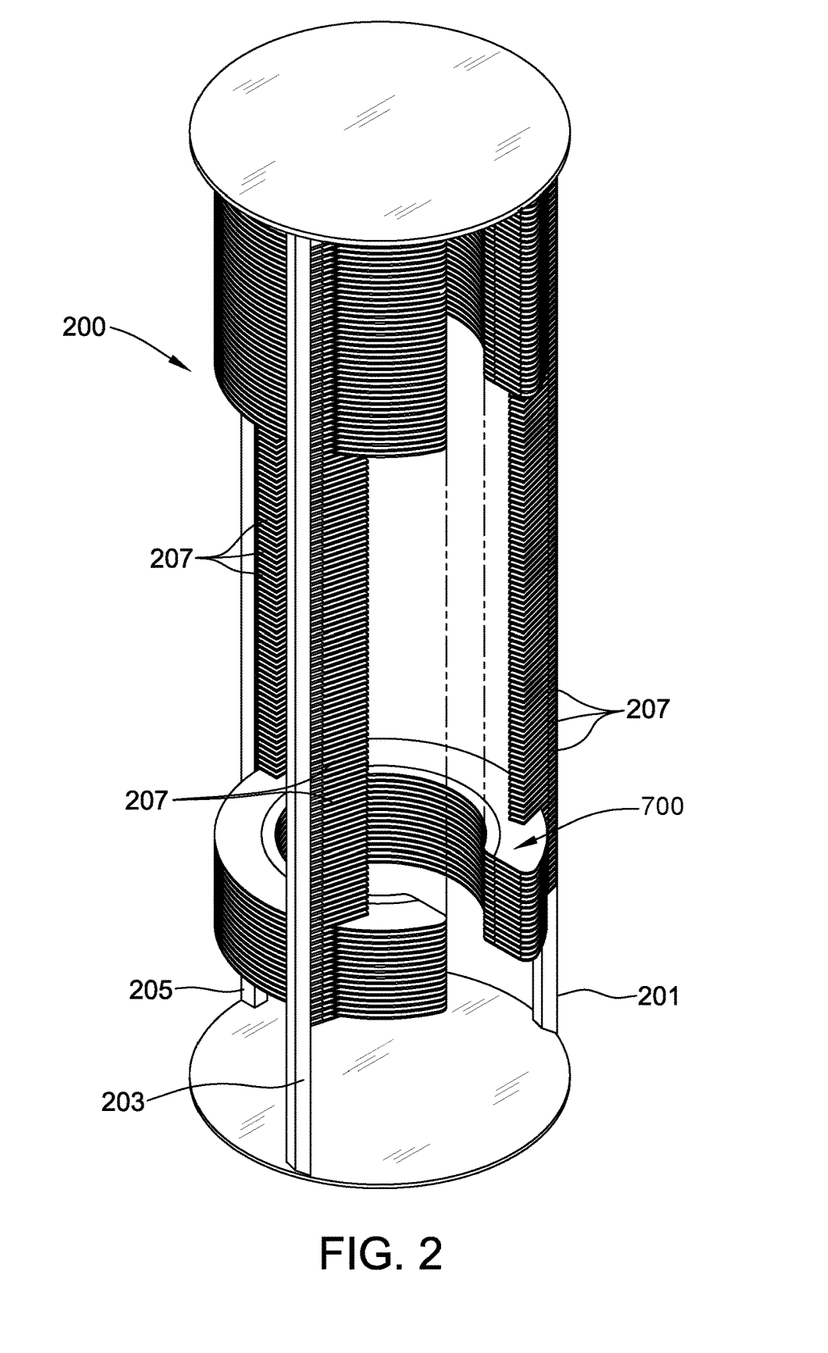
FIG. 2 is a perspective view of a wafer boat that holds silicon wafers for use with the vertical furnace shown in FIG. 1.

Referring now to FIG. 2, wafer boat 200 supports a plurality of wafer support rings 700. Wafer boat 200 holds a semiconductor wafers supported individually by wafer support rings 700, which allows for batch processing of multiple semiconductor wafers. For example, a plurality of wafer support rings and supported wafers are loaded into wafer boat 200. Wafer boat 200 is inserted within vertical furnace 100 and one or more heat treatments are conducted. Wafer boat 200 is then removed, and individual wafers are removed from wafer support rings 700 and wafer boat 200.

In one embodiment, wafer boat 200 includes three columns 201, 203, and 205. Each column supports a plurality of fingers 207. Each wafer support ring 700 is supported by a finger 207 from a first support column 201, a finger 207 from a second support column 203, and a finger 207 from a third support column 205. Fingers 207 are spaced vertically from each other a distance sufficient to accommodate wafer support ring 700 and a wafer supported by wafer support ring 700. Suitably, the vertical distance between fingers 207 is minimized to increase the number of wafers that wafer boat 200 can hold. In some embodiments, the configuration of wafer support ring 700 facilitates minimizing the distance between fingers 207. For example, in some embodiments, wafer support rings 700 are shaped to minimize the profile of wafer support rings 700 and fingers 207.

Figure 3:
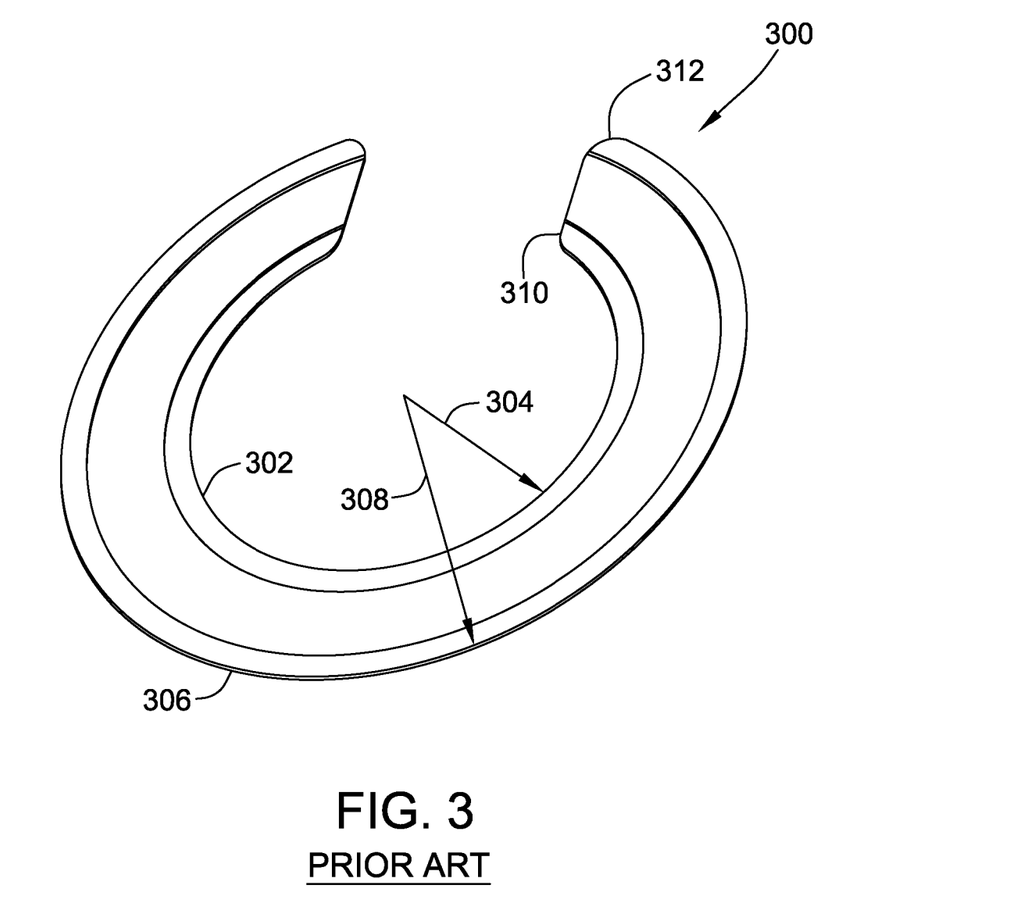
FIG. 3 is a perspective view of a wafer support ring for use with the wafer boat shown in FIG. 2.
Figure 4:
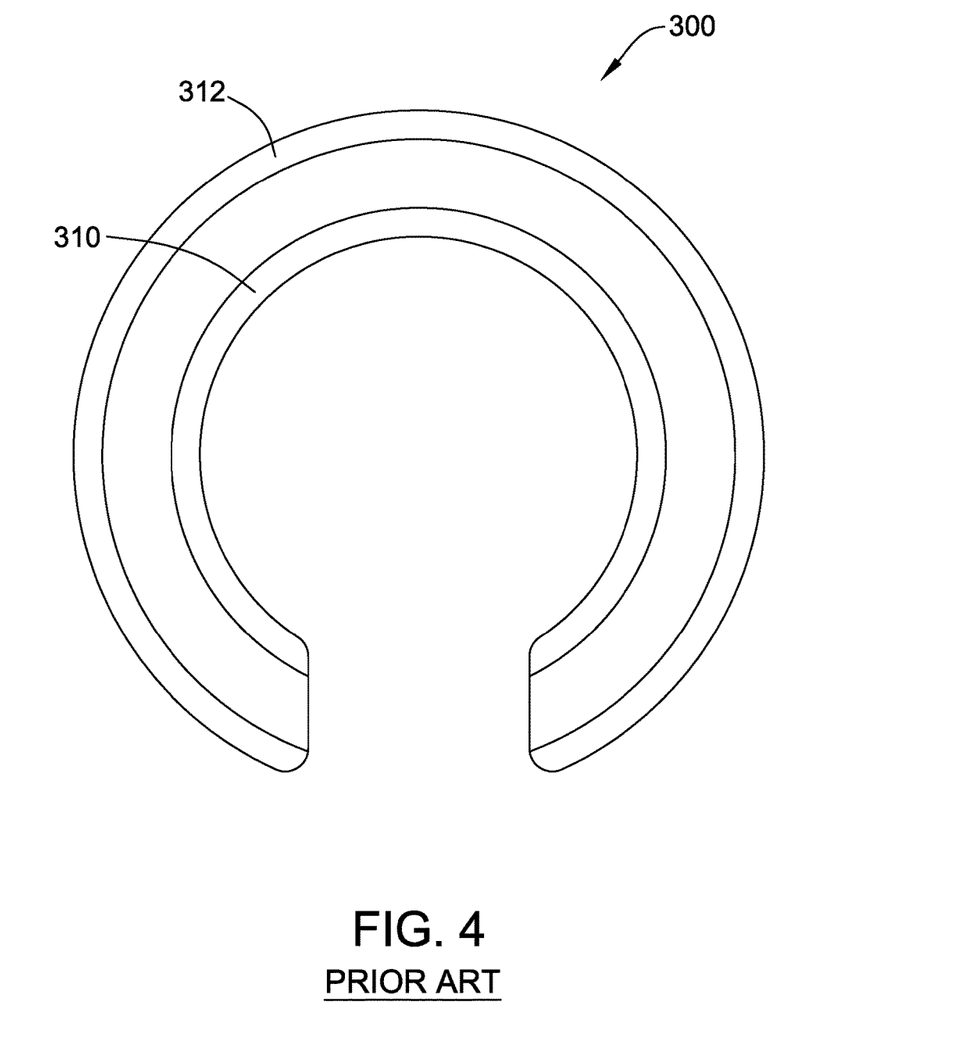
FIG. 4 is a top view of the wafer support ring shown in FIG. 3.

Referring now to prior art FIGS. 3 and 4, a wafer support ring 300 supports a semiconductor wafer and can be inserted within wafer boat 200. Wafer support ring 300 includes a radial inner wall 302 defining an inner radius 304, a radial outer wall 306 defining an outer radius 308, a radial inner plateau 310, and a radial outer plateau 312. Radial outer plateau 312 extends from radial outer wall 306 in a direction towards radial inner wall 302. Accordingly, when the semiconductor wafer is positioned on wafer support ring 300, radial outer plateau 312 contacts the semiconductor wafer adjacent an outer edge of the semiconductor wafer.

Figure 5:
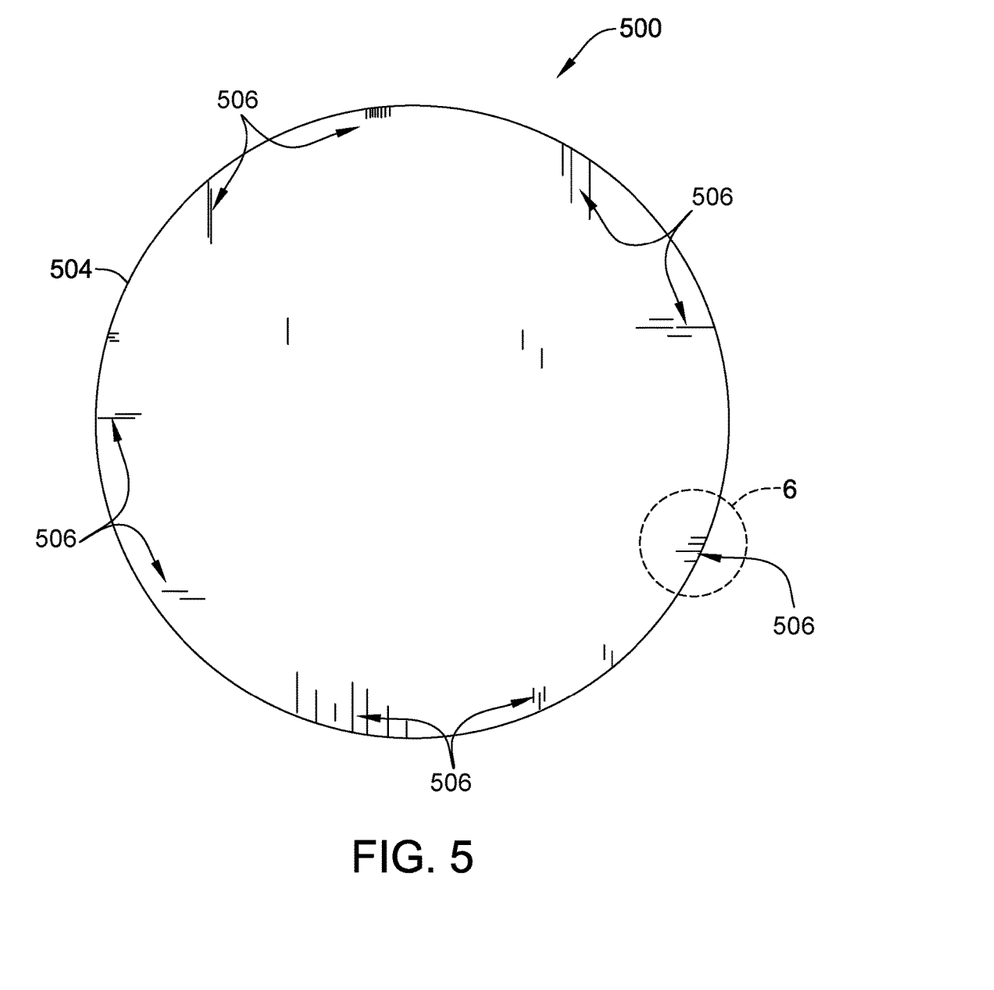
FIG. 5 is a schematic front view of damage to a silicon wafer caused by slip dislocations resulting from furnace slip and the wafer support ring shown in FIG. 3.
Figure 6:
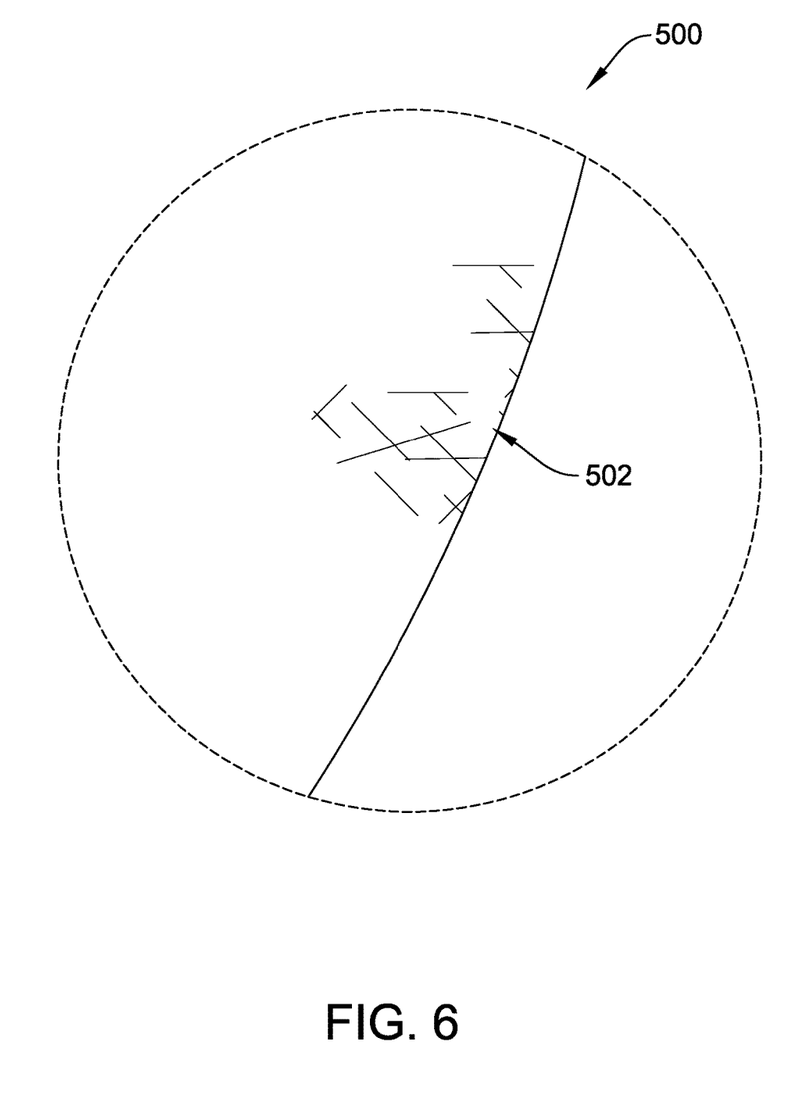
FIG. 6 is an illustration of backside damage of the silicon wafer shown in FIG. 5.

FIGS. 5 and 6 show a semiconductor wafer 500 that has been removed from wafer support ring 300 after heat treatment. Semiconductor wafer 500 has damage 502 caused by wafer support ring 300 contacting semiconductor wafer 500. In particular, damage 502 is disposed on the backside of semiconductor wafer 500 (shown in FIG. 6) adjacent an outer edge 504 at locations where semiconductor wafer 500 was contacted by radial outer plateau 312 of wafer support ring 300. Damage 502 to the backside of semiconductor wafer 500 may cause wafer slips in downstream thermal processes and may cause semiconductor wafer 500 to be unsatisfactory for use in semiconductors. Wafer slip dislocations caused, for example, by furnace slip are indicated by reference number 506.

Figure 7:
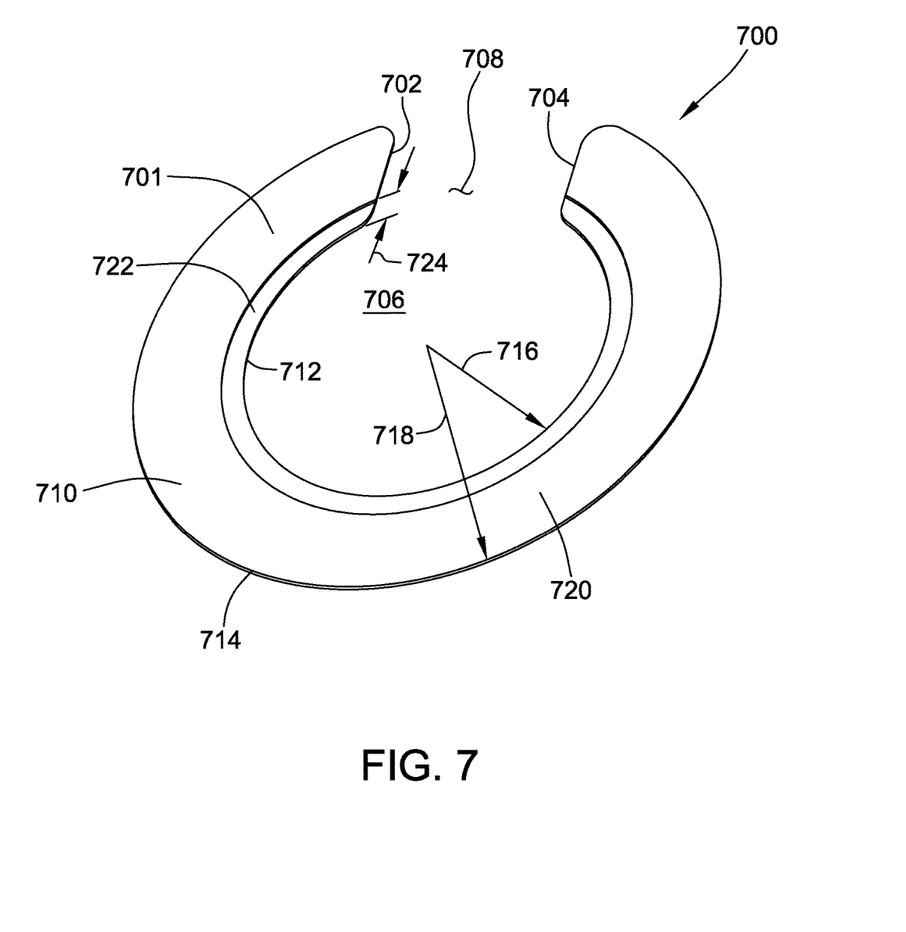
FIG. 7 is an illustration of an alternative wafer support ring for use with the wafer boat shown in FIG. 2.

Referring now to FIG. 7, wafer support ring 700 supports a semiconductor wafer and can be inserted within wafer boat 200. In suitable embodiments, wafer support ring 700 may be any shape that enables wafer support ring 700 to function as described. In this embodiment, wafer support ring 700 includes a semicircular segment 701. As used herein, the term "semicircular" refers to any portion of a full circle and generally includes arcs measuring greater than 180 degrees. Semicircular segment 701 terminates at two opposed ends 702, 704 and defines an open center area 706. A gap 708 is defined between the two opposed ends 702, 704. In some embodiments, open center area 706 and gap 708 may be omitted such that wafer support ring 700 forms a substantially complete circle.

In one embodiment, wafer support ring 700 further includes a top 710 and a bottom (not shown) opposite top 710. A radial inner wall 712 and a radial outer wall 714 extend between top 710 and the bottom. Radial inner wall 712 defines an inner radius 716 and radial outer wall 714 defines an outer radius 718. Outer radius 718 is sized to accommodate semiconductor wafers of different sizes. In some embodiments, outer radius 718 is substantially equal to or less than a radius of a semiconductor wafer. In some embodiments, outer radius 718 may be in a range from about 50 millimeters (mm) (2 inches (in.)) to about 300 mm (12 in.) or about 75 mm (3 in.) to about 250 mm (10 in.). In further embodiments, outer radius 718 may be approximately 100 mm (4 in.) or approximately 150 mm (6 in.) or approximately 225 mm (9 in.). Inner radius 716 is less than both outer radius 718 and the radius of the semiconductor wafer supported by wafer support ring 700. In some embodiments, inner radius 716 is in a range from about three fifths to about four fifths of the radius of the semiconductor wafer. In this embodiment, inner radius 716 is equal to approximately two thirds of the radius of the semiconductor wafer.

Top 710 defines an upper surface 720 extending between radial inner wall 712 and radial outer wall 714. A plateau 722 is disposed on and projects from top 710 such that the semiconductor wafer is supported on plateau 722 of wafer support ring 700 without contacting upper surface 720. Accordingly, wafer support ring 700 is configured to support a semiconductor wafer without wafer support ring 700 contacting the outer edge portion of the semiconductor wafer. As a result, damage 502 (shown in FIGS. 5 and 6) to the backside of the semiconductor wafer is reduced.

Suitably, wafer support ring 700 includes only one plateau 722 and is free of additional plateaus. However, in some embodiments wafer support ring 700 may include a plurality of plateaus 722 without departing from some aspects of this disclosure. For example, in one embodiment, wafer support ring 700 may include a second plateau (not shown) that has a height less than the height of plateau 722. In further embodiments, wafer support ring 700 may include a plurality of plateaus 722 configured to minimize contact between wafer support ring 700 and the outer edge portion of the semiconductor wafer.

In suitable embodiments, plateau 722 may be disposed on any portion of top 710 that enables wafer support ring 700 to function as described. In this embodiment, plateau 722 is disposed adjacent radial inner wall 712 and extends annularly along an arc. In addition, plateau 722 extends radially from radial inner wall 712 in a direction towards radial outer wall 714. A width 724 of plateau 722 is defined in the radial direction and is less than the difference between inner radius 716 and outer radius 718. In some embodiments, width 724 is in a range from about 1 mm (0.04 in.) to about 10 mm (0.4 in.) or about 2 mm (0.08 in.) to about 10 mm (0.4 in.). In this embodiment, width 724 is approximately 10 mm (0.4 in.).

In suitable embodiments, plateau 722 may extend any annular distance that enables wafer support ring 700 to function as described. In the illustrated embodiment, plateau 722 extends continuously through the entire semicircular segment 701 of wafer support ring 700. In other embodiments, plateau may extend less than the entire annular distance of semicircular segment 701. For example, in some embodiments, plateau 722 includes a plurality of segments spaced annularly throughout wafer support ring 300.

In suitable embodiments, plateau 722 may have any shape and size that enables wafer support ring 700 to function as described. In this embodiment, plateau 722 is rectangular in cross-section having a height perpendicular to width 724. In some embodiments, plateau 722 has a height in a range from about 0.05 mm (0.002 in.) to about 1 mm (0.04 in.) or about 0.1 mm (0.004 in.) to about 0.5 mm (0.02 in.). In this embodiment, plateau 722 has a height of approximately 0.2 mm (0.008 in.).

A surface roughness of plateau 722 facilitates plateau 722 contacting and supporting semiconductor wafers without substantially damaging the semiconductor wafers. In suitable embodiments, plateau 722 may have any surface roughness that enables plateau 722 to function as described. In some embodiments, plateau 722 has a surface roughness in a range from about 0.3 micrometers (μm) (0.00001 in.) to about 1 μm (0.00004 in.). In this embodiment, plateau 722 has a surface roughness of approximately 0.5 μm (0.00002 in.).

Wafer support ring 700 may include any materials that enable wafer support ring 700 to function as described. Suitably, wafer support ring 700 is made of a material that withstands temperatures in excess of 1000° Celsius (C) and is nonreactive to materials in semiconductor wafers. In some embodiments, wafer support ring 700 includes the following, without limitation: single crystalline silicon, polysilicon, silicon carbide, silicon nitride, quartz, tantalum carbide, and combinations thereof. In one embodiment, wafer support ring 700 is made of single crystalline silicon, for example, the ring is machined from a unitary piece of single crystalline silicon.

Figure 8:
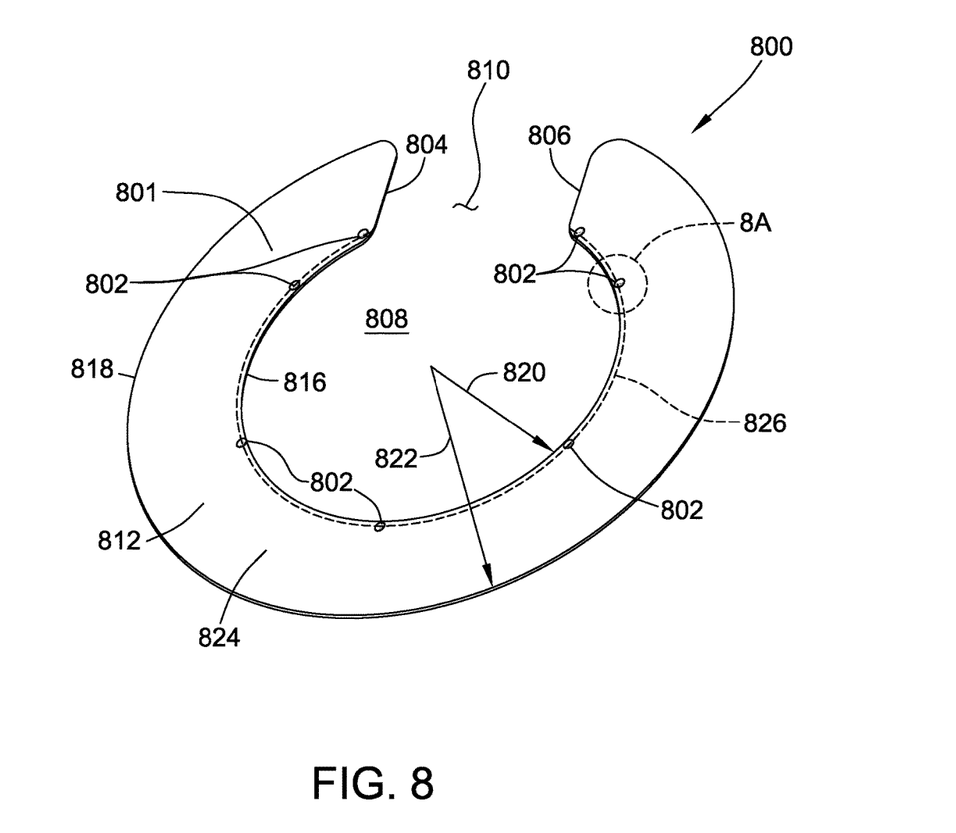
FIG. 8 is an illustration of another alternative wafer support ring for use with the wafer boat shown in FIG. 2.

Referring now to FIG. 8, a wafer support ring 800 is similar to wafer support ring 700. Wafer support ring 800 also supports a semiconductor wafer and can be inserted within wafer boat 200. Wafer support ring 800 includes protrusions 802 for contacting a semiconductor wafer. In suitable embodiments, wafer support ring 800 may be any shape that enables wafer support ring 800 to function as described. In the exemplary embodiment, wafer support ring 800 includes a semicircular segment 801 that terminates at two opposed ends 804, 806 and defines an open center area 808. A gap 810 is defined between opposed ends 804, 806. In some embodiments, open center area 808 and gap 810 may be omitted such that wafer support ring 800 forms a substantially complete circle.

In one embodiment, wafer support ring 800 includes a top 812 and a bottom (not shown) opposite top 812. A radial inner wall 816 and a radial outer wall 818 extend between top 812 and the bottom. Radial inner wall 816 defines an inner radius 820 and radial outer wall 818 defines an outer radius 822. Outer radius 822 is sized to accommodate semiconductor wafers of different sizes. In some embodiments, outer radius 822 is substantially equal to or less than a radius of a semiconductor wafer. In some embodiments, outer radius 822 may be in a range from about 50 mm (2 in.) to about 300 mm (12 in.) or about 75 mm (3 in.) to about 250 mm (10 in.). In some further embodiments, outer radius 822 may be approximately 100 mm (about 4 in.) or approximately 150 mm (about 6 in.) or approximately 225 mm (about 9 in.). Inner radius 820 is less than both outer radius 822 and the radius of the semiconductor wafer supported by wafer support ring 800.

Top 812 defines an upper surface 824 extending between radial inner wall 816 and radial outer wall 818. Protrusions 802 is disposed on and projects from top 812 such that the semiconductor wafer is supported on protrusions 802 of wafer support ring 300 without contacting upper surface 824. Accordingly, wafer support ring 800 is configured to support the semiconductor wafer without contacting the outer edge portion of the semiconductor wafer.

Figure 8A:
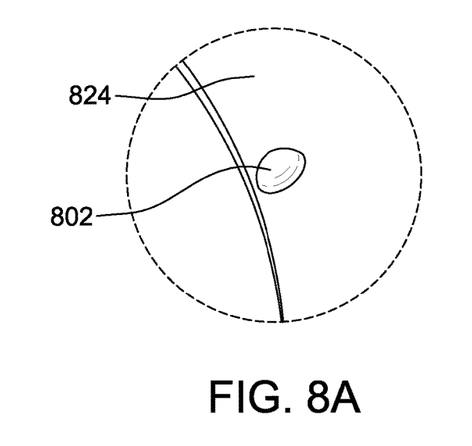
FIG. 8A is a detail view of a protrusion of the wafer support ring shown in FIG. 8.

In suitable embodiments, protrusions 802 may have any shape and size that enable wafer support ring 800 to function as described. As shown in FIG. 8A, each protrusion 802 has a hemispherical shape. In some embodiments, at least some of protrusions 802 have a radius in a range from about 1 mm (0.04 in.) to about 20 mm (0.8 in.) or about 4 mm (0.2 in.) to about 10 mm (0.4 in.). In this embodiment, each protrusion 802 has a radius of approximately 4 mm (0.2 in.). In other embodiments, protrusions 802 may have differing shapes.

A surface roughness of protrusions 802 facilitates protrusions 802 contacting and supporting semiconductor wafers without substantially damaging the semiconductor wafers. In suitable embodiments, protrusions 802 may have any surface roughness that enables protrusions 802 to function as described. In some embodiments, protrusions 802 have a surface roughness in a range from about 0.3 μm (0.00001 in.) to about 1 μm (0.00004 in.). In this embodiment, protrusions 802 have a surface roughness of approximately 0.5 μm (0.00002 in.).

In suitable embodiments, protrusions 802 may be disposed on any portions of wafer support ring 800 that enable wafer support ring 800 to function as described. In this embodiment, protrusions 802 are annularly aligned and are spaced equidistant from a center of wafer support ring 800. Specifically, protrusions 802 are annularly aligned along an arc 826 adjacent radial inner wall 816. In this embodiment, top 812 is free of any protrusions 802 disposed between arc 826 and radial outer wall 818. The radius of arc 826 is greater than inner radius 820 and less than outer radius 822. In this embodiment, arc 826 has a radius that is equal to approximately two thirds of the radius of the semiconductor wafer supported by wafer support ring 800. In other embodiments, protrusions may be aligned along an arc having any radius that enables protrusions 802 to function as described.

In further embodiments, at least some of protrusions 802 may not be aligned along arc 826.

Protrusions may be spaced apart any distances that enable wafer support ring 800 to function as described. In the illustrated embodiment, protrusions 802 are annularly spaced distances that vary along arc 826. In particular, protrusions 802 are more closely spaced adjacent gap 810 to provide greater support for a semiconductor wafer adjacent gap 810. In other embodiments, protrusions may be spaced any equal and unequal distances, and not necessarily annular distances.

Wafer support ring 800 may include any number of protrusions 802. For example, in some embodiments, wafer support ring 800 may include at least three protrusions 802 spaced apart approximately 120°. In this embodiment, wafer support ring 800 includes seven protrusions.

Protrusions 802 and semicircular segment 801 may be formed from any material. In this embodiment, protrusions 802 are integrally formed with semicircular segment 801. For example, semicircular segment 801 and protrusions 802 may be machined from single crystalline silicon. In other embodiments, protrusions 802 may be formed separately from semicircular segment 801 from materials that are similar and/or different from the materials of semicircular segment 801.

Referring now to FIGS. 9-14, a wafer support ring 900 is similar to wafer support ring 800. Wafer support ring 900 also supports a semiconductor wafer and can be inserted within wafer boat 200. Wafer support ring 900 includes a pins 902 disposed in a slots 904. In suitable embodiments, wafer support ring 900 may be any shape that enables wafer support ring 900 to function as described. In this embodiment, wafer support ring 900 includes a semicircular segment 901 that terminates at two opposed ends 906, 908 and defines an open center area 910. A gap 912 is defined between opposed ends 906, 908. In some embodiments, open center area 910 and gap 912 may be omitted such that wafer support ring 900 forms a substantially complete circle.

Figure 11:
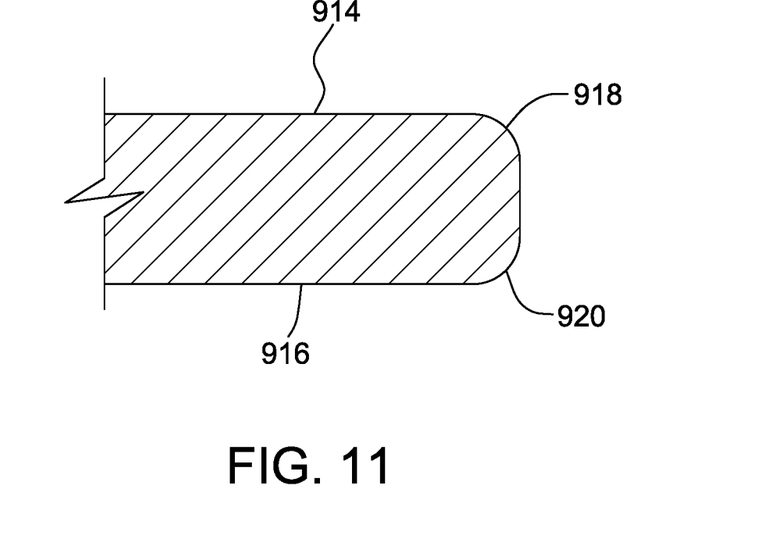
FIG. 11 is a section view of a portion of the wafer support ring shown in FIG. 10.
Figure 12:
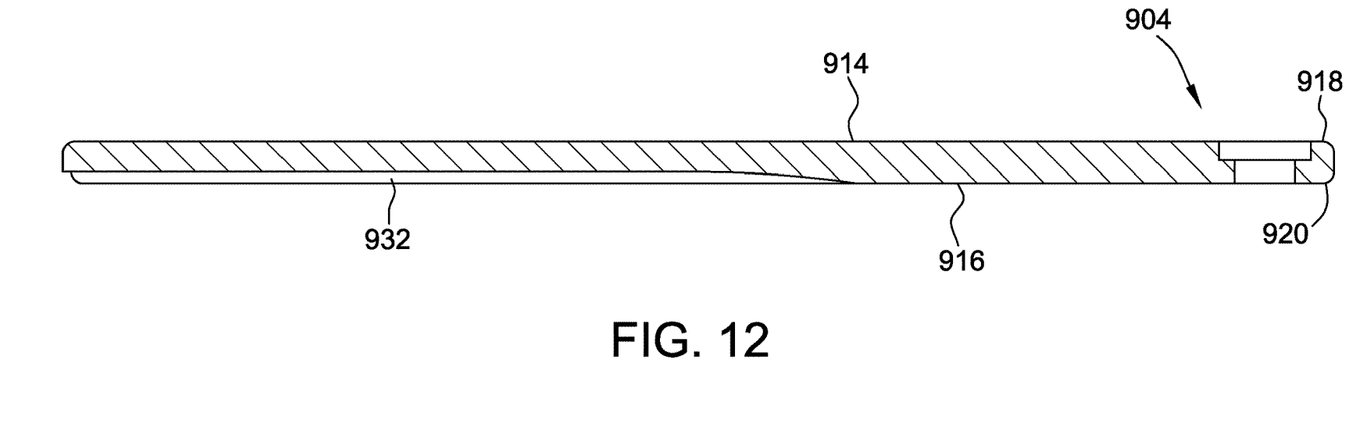
FIG. 12 is a section view of an additional portion of the wafer support ring shown in FIG. 10.

In one embodiment, wafer support ring 900 includes a top 914 and a bottom 916 opposite top 914. As shown in FIG. 11, top 914 and bottom 916 include curved portions 918 and 920 to reduce sharp edges that could potentially cause damage to semiconductor wafers. A radial inner wall 922 and a radial outer wall 924 extend between top 914 and bottom 916. Radial inner wall 922 defines an inner radius 926 and radial outer wall 924 defines an outer radius 928. Outer radius 928 may be sized to accommodate semiconductor wafers of different sizes. In some embodiments, outer radius 928 is substantially equal to a radius of the semiconductor wafer supported by wafer support ring 900. In suitable embodiments, outer radius 928 may be in a range from about 50 mm (2 in.) to about 300 mm (12 in.) or about 75 mm (3 in.) to about 250 mm (10 in.). In exemplary embodiments, outer radius 928 is approximately 100 mm (4 in.) or approximately 150 mm (6 in.) or approximately 225 mm (9 in.). Inner radius 926 is less than both outer radius 822 and the radius of the semiconductor wafer supported by wafer support ring 800.

Figure 9:
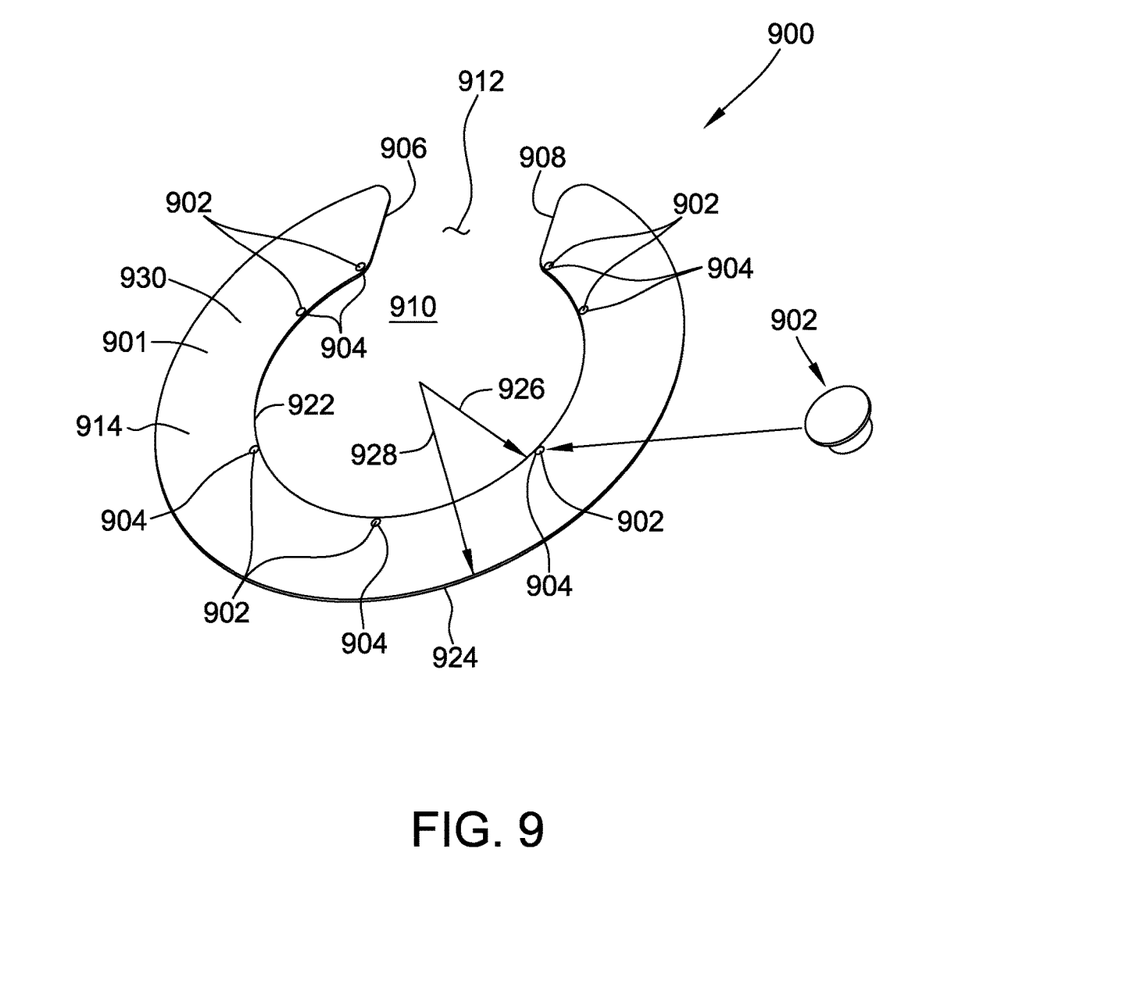
FIG. 9 is an illustration of a further alternative wafer support ring for use with the wafer boat shown in FIG. 2.

In this embodiment, top 914 defines an upper surface 930 extending between radial inner wall 922 and radial outer wall 924. Slots 904 are defined in top 914 and configured for receiving pins 902. Pins 902 are configured to be at least partially inserted in slots 904 such that at least a portion of pins 902 projects from top 914. Accordingly, the semiconductor wafer is supported on pins 902 of wafer support ring 900 such that the semiconductor wafer does not contact upper surface 930.

Figure 10:
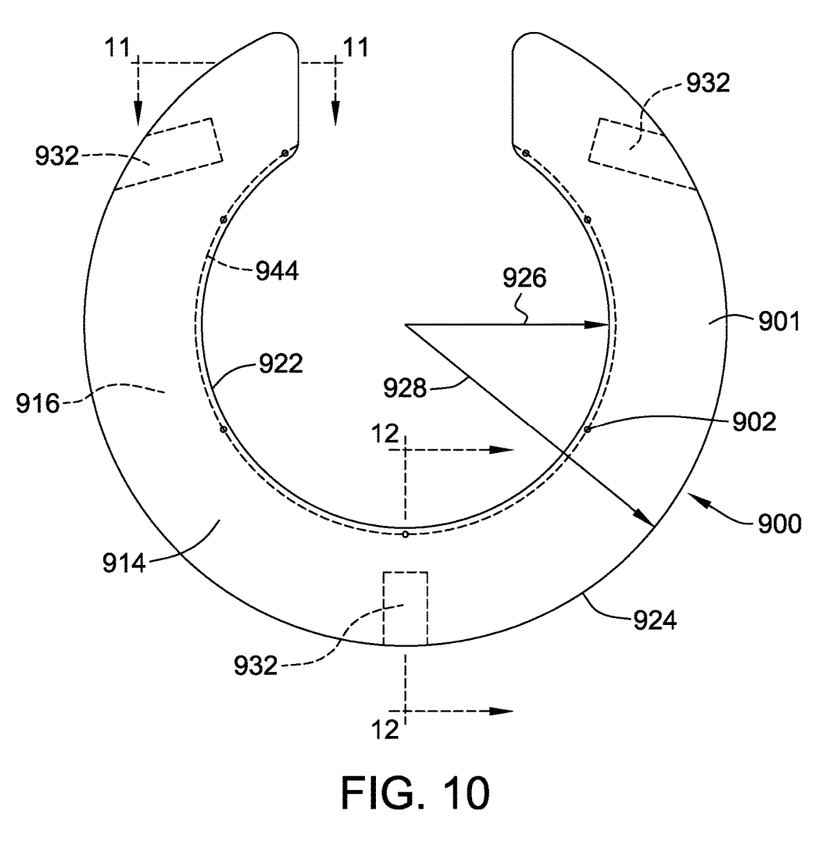
FIG. 10 is a top view of the wafer support ring shown in FIG. 9.

With reference now to FIG. 10, bottom 916 defines a plurality of grooves 932 for receiving fingers 207 of wafer boat 200. Grooves 932 facilitate wafer support ring 900 being aligned in and supported by wafer boat 200. Grooves 932 facilitate fingers 207 supporting wafer support ring 900 in a substantially stationary position as semiconductor wafers are loaded and unloaded from wafer boat 200. Moreover, grooves 932 provide a reduced thickness of wafer support ring 900 adjacent fingers 207 such that the profile of wafer support rings 900 and supporting fingers 207 is reduced.

Figure 14:
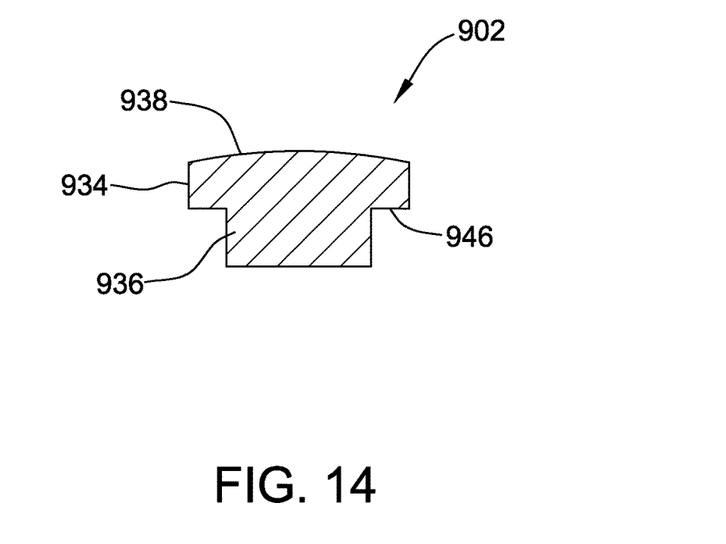
FIG. 14 is a detail view of the pin shown in FIG. 9.

As best seen in FIG. 14, in this embodiment, pins 902 have a top portion 934 and a base portion 936. Top portion 934 has a cylindrical shape with a curved surface 938. In the illustrated embodiment, curved surface 938 has a convex shape. Base portion 936 extends from top portion 934 in a direction away from curved surface 938. In the illustrated embodiment, base portion 936 and top portion 934 are coaxial and top portion 934 has a greater radius than base portion 936. Therefore, top portion 934 extends radially beyond base portion 936 to form an overhang 946.

Figure 13:
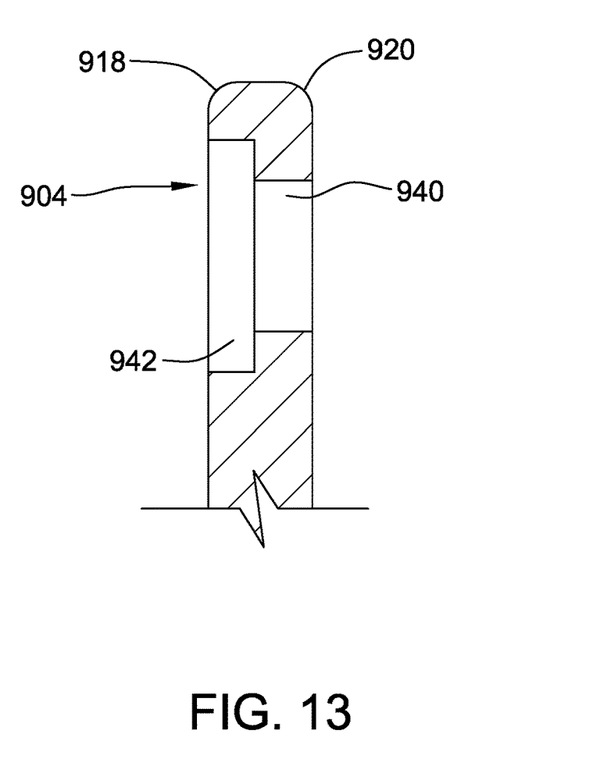
FIG. 13 is a detail view of the pin slot shown in FIG. 12.

As shown in FIG. 13, each of slots 904 has a shape configured to receive pin 902. In the illustrated embodiment, slot 904 has a base portion 940 and a top portion 942 sized slightly larger than respective base portion 936 and top portion 934 of pin 902. Base portion 940 and top portion 942 are configured such that curved surface 938 projects above upper surface 930 when pin 902 is fully inserted in slot 904. In this embodiment, slot 904 is dimensioned sufficiently larger than pin 902 such that pin 902 is able to move horizontally, relative to the semicircular segment, within slot 904.

In suitable embodiments, pins 902 are any size that enable wafer support ring 900 to function as described. In some embodiments, top portions 934 of pins 902 have a diameter in a range from about 1 mm (0.04 in.) to about 30 mm (1 in.) or about 5 mm (0.2 in.) to about 20 mm (0.8 in.). In this embodiment, top portions 934 of pins 902 have a diameter of approximately 11 mm (0.4 in.). In some embodiments, top portions 934 project above upper surface 930 a distance in a range from about 0.1 mm (0.004 in.) to about 0.5 mm (0.02 in.). In this embodiment, top portions 934 of pins 902 project above upper surface 930 a distance of approximately 0.2 mm (0.008 in.). In this embodiment, all pins 902 have the same size and shape, which simplifies manufacture and assembly of wafer support ring 900. In other embodiments, at least some of pins 902 may have different sizes and/or shapes.

Curved surface 938 has a surface roughness that facilitates pin 902 contacting semiconductor wafers without substantially damaging the semiconductor wafers. In some embodiments, the surface roughness of curved surface 938 is in a range from about 0.3 μm (0.00001 in.) to about 1 μm (0.00004 in.). In this embodiment, curved surface 938 has a surface roughness of approximately 0.5 μm (0.00002 in.). In other embodiments, curved surface 938 may have any surface roughness that enables pins 902 to function as described.

In suitable embodiments, pins 902 may be disposed on any portions of wafer support ring 900 that enable wafer support ring 900 to function as described. In this embodiment, pins 902 are annularly aligned and spaced equidistant from a center of wafer support ring 900. Pins 902 are annularly aligned along an arc 944 adjacent radial inner wall 922. In this embodiment, top 914 is free of any pins 902 disposed between arc 944 and radial outer wall 924. The radius of arc 944 is greater than inner radius 926 and less than outer radius 928. In this embodiment, the radius of arc 944 is equal to approximately two thirds of the radius of the semiconductor wafer supported by wafer support ring 900. In other embodiments, arc 944 may have any radius that enables pins 902 to function as described. In the illustrated embodiment, the annular spacing of pins 902 varies throughout wafer support ring 900. In other embodiments, pins 902 may be equally spaced throughout wafer support ring 900 without departing from some aspects of this disclosure.

Wafer support ring 900 may include any number of pins 902 and slots 904. For example, in some embodiments, wafer support ring 900 may include at least three pins 902 and three slots 904 spaced apart approximately 120°. In this embodiment, wafer support ring 800 includes seven pins 902 and seven slots 904. In other embodiments, wafer support ring 900 may include more or less of pins 902 and/or slots 904. For example, in some embodiments, wafer support ring 900 may include a greater number of slots 904 than pins 902 to facilitate selectively positioning pins 902 in different slots 904.

Wafer support ring 900 and pins 902 may be formed from any suitable material. Wafer support ring 900 can be made of a broader range of materials because pins 902 support the semiconductor wafers without the wafers contacting portions of wafer support ring 900. In this embodiment, pins 902 are made of quartz and wafer support ring 900 is machined from silicon carbide. In other embodiments, pins 902 and wafer support ring 900 may be formed from the same material.

Embodiments of the wafer support rings herein achieve superior results compared to prior wafer support rings. For example, the wafer support rings reduce the contact of the wafer support rings on semiconductor wafers supported by the wafer support rings. Specifically, the embodiments described reduce contact between the wafer support rings and the edge portions of the semiconductor wafers. As a result, in some embodiments, the wafer support rings reduce damage to the semiconductor wafers. Additionally, in some embodiments, the wafer support rings inhibit wafer slips due to lateral movement of the semiconductor wafers on the wafer support rings.

In some embodiments, portions of the wafer support rings may be made of materials that withstand substantially high temperatures and/or have a rate of expansion that is substantially equal to the rate of expansion of the semiconductor wafers. In addition, in some embodiments, the wafer support rings can be formed at a reduced cost and in less time than other wafer support rings.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A support ring for supporting a semiconductor wafer in a boat of a vertical furnace used in processing of the semiconductor wafer, the support ring comprising:
    a semicircular segment having an upper surface, a lower surface opposite the upper surface, a radial inner wall, and a radial outer wall;
    slots in the upper surface of the semicircular segment; and
    pins extending above the upper surface, each pin located partially within a corresponding slot of the slots,
    wherein the pins are configured to support the semiconductor wafer such that the semiconductor wafer does not contact the upper surface of the semicircular segment,
    wherein the pins are located along an arc having a radius that is equal to two thirds of a radius of the semiconductor wafer, the radial inner wall defining an inner radius and the outer radial wall defining an outer radius, and wherein the radius of the arc is greater than the inner radius and less than the outer radius,
    wherein each slot defines an opening dimensioned larger than a corresponding pin such that the pins are movable horizontally relative to the semicircular segment within the slots.

2. The support ring of claim 1, wherein the support ring is made of silicon carbide and the pins are made of quartz.

3. The support ring of claim 1, in combination with a vertical furnace for annealing semiconductor wafers, the vertical furnace including a chamber, a heating element adjacent the chamber for heating the chamber and a wafer boat for holding the support ring and the semiconductor wafers within the chamber during annealing of the semiconductor wafer.

* * * * *